(12) United States Patent
New

(10) Patent No.: US 9,177,944 B2
(45) Date of Patent: Nov. 3, 2015

(54) SEMICONDUCTOR DEVICE WITH STACKED POWER CONVERTER

(75) Inventor: Bernard J. New, Carmel Valley, CA (US)

(73) Assignee: XILINX, INC., San Jose, CA (US)

( * ) Notice: Subject to any disclaimer, the term of this patent is extended or adjusted under 35 U.S.C. 154(b) by 356 days.

(21) Appl. No.: 12/960,288

(22) Filed: Dec. 3, 2010

(65) Prior Publication Data

US 2012/0139103 A1   Jun. 7, 2012

(51) Int. Cl.
*H01L 23/50* (2006.01)
*H01L 25/16* (2006.01)
(Continued)

(52) U.S. Cl.
CPC ............ *H01L 25/16* (2013.01); *H01L 23/3121* (2013.01); *H01L 23/481* (2013.01); *H01L 23/49822* (2013.01); *H01L 23/528* (2013.01); *H01L 24/13* (2013.01); *H01L 24/16* (2013.01); *H01L 24/48* (2013.01); *H01L 24/73* (2013.01); *H01L 24/92* (2013.01); *H01L 2224/0401* (2013.01); *H01L 2224/04042* (2013.01); *H01L 2224/131* (2013.01); *H01L 2224/16145* (2013.01); *H01L 2224/32225* (2013.01); *H01L 2224/48227* (2013.01); *H01L 2224/73207* (2013.01); *H01L 2224/73257* (2013.01); *H01L 2224/73265* (2013.01); *H01L 2224/92127* (2013.01); *H01L 2224/92227* (2013.01); *H01L 2225/0651* (2013.01); *H01L 2225/06513* (2013.01); *H01L 2225/06541* (2013.01); *H01L 2924/1461* (2013.01); *H01L 2924/15311* (2013.01); *H01L 2924/18161* (2013.01); *H01L 2924/19041* (2013.01); *H01L 2924/19042* (2013.01); *H01L 2924/19104* (2013.01)

(58) Field of Classification Search
None
See application file for complete search history.

(56) References Cited

U.S. PATENT DOCUMENTS

2002/0125556 A1*  9/2002  Oh et al. ................. 257/685
2003/0081389 A1   5/2003  Nair et al.
(Continued)

FOREIGN PATENT DOCUMENTS

CN    1512578    7/2004
CN    1649144    8/2005
(Continued)

OTHER PUBLICATIONS

Enpirion, Inc., EN5366Q1, "6A Voltage Mode Synchronous Buck PWM DC-DC Converter with Integrated Inductor External Output Voltage Programming", Rev 1.0 Nov. 2006, 1-16 pp., Bridgewater, NJ, www.enpirion.com.
(Continued)

*Primary Examiner* — Matthew W Such
*Assistant Examiner* — Abul Kalam
(74) *Attorney, Agent, or Firm* — Robert M. Brush; John J. King

(57) ABSTRACT

A semiconductor device with a stacked power converter is described. In some examples, a semiconductor device includes: a first integrated circuit (IC) die having bond pads and solder bumps, the bond pads configured for wire-bonding; and a second IC die mounted on the first IC die, the second IC die having an active side and a backside opposite the active side, the second IC die including bond pads on the active side configured for wire-bonding, and solder bumps disposed on a backside opposite the active side; where the solder bumps of the first IC die are electrically and mechanically coupled to the solder bumps of the second IC die to form bump bonds.

20 Claims, 4 Drawing Sheets

(51) Int. Cl.
*H01L 23/31* (2006.01)
*H01L 23/48* (2006.01)
*H01L 23/498* (2006.01)
*H01L 23/528* (2006.01)
*H01L 23/00* (2006.01)

(56) References Cited

U.S. PATENT DOCUMENTS

| | | |
|---|---|---|
| 2003/0147225 A1 | 8/2003 | Kenny, Jr. et al. |
| 2004/0125579 A1* | 7/2004 | Konishi et al. ............... 361/783 |
| 2004/0240245 A1 | 12/2004 | Kenny, Jr. et al. |
| 2005/0151237 A1 | 7/2005 | Kim et al. |
| 2007/0013080 A1* | 1/2007 | DiBene et al. ............... 257/777 |
| 2007/0035020 A1 | 2/2007 | Umemoto |
| 2007/0166879 A1* | 7/2007 | Fang ............................ 438/106 |
| 2008/0217767 A1 | 9/2008 | Tago |
| 2008/0237891 A1 | 10/2008 | Irsigler et al. |
| 2009/0302438 A1 | 12/2009 | Chauhan et al. |
| 2010/0052111 A1* | 3/2010 | Urakawa ...................... 257/621 |

FOREIGN PATENT DOCUMENTS

| | | |
|---|---|---|
| CN | 1934704 | 3/2007 |
| CN | 101207055 | 6/2015 |
| JP | 2001-185676 | 7/2001 |
| JP | 2002-158326 | 5/2002 |
| JP | 2008-085362 | 4/2008 |
| JP | 2010-056139 | 3/2010 |
| JP | 2010-080781 | 4/2010 |
| JP | 2010-206211 | 9/2010 |
| WO | WO2005/093834 A1 | 6/2005 |

OTHER PUBLICATIONS

Schrom, G. et al., "Feasibility of Monolithic and 3D-Stacked DC-DC Converters for Microprocessors in 90nm Technology Generation", 9.3, ISLPED'04, Aug. 9-11, 2004, 263-268 pp., Newport Beach, CA, USA.

Friedman, Eby G., "Challenges and Recent Research in On-Chip Power Delivery", Department of Electrical Engineering, Advanced Circuit Research Center, Technion, Jul. 18, 2010, pp. 1-64.

Zhao, Min et al., "Optimal Placement of Power-Supply Pads and Pins", IEEE Transactions on Computer-Aided Design of Integrated Circuits and Systems, vol. 25, No. 1, Jan. 2006, pp. 144-154.

* cited by examiner

SEMICONDUCTOR DEVICE WITH STACKED POWER CONVERTER

FIELD OF THE INVENTION

One or more aspects of the present invention relate generally to semiconductor devices and, more particularly, to a semiconductor device with a stacked power converter.

BACKGROUND

Integrated circuits (ICs) have become increasingly complex, requiring more input/output (IO) pins and operating current on smaller die sizes. In wire-bonded IC packages, it becomes difficult to balance IO, current, and die size requirements. Notably, a smaller die size yields less area for bond pads that can be used for IO. It is well known that, independent of the function being implemented, the minimum area of a wire-bonded IC is determined by the number of bond pads that must be instantiated along its periphery and the minimum pitch of such bond pads. Further, some of the bond pads must be used for "overhead" (i.e., not for user-defined IO), such as for power supply. With a silicon-technology-driven trend towards lower power-supply voltages, the supply current has had to rise even faster than an increasing need for power. Since the current-carrying capability of a bond wire has not increased, the number of power-supply bond pads has risen dramatically, yielding even less bond pads for IO use. Similarly, package pins have a limited current carrying capability. Consequently, the higher power-supply currents have also increased the number of package pins that must be set aside for the power supply, reducing the number of pins available for other purposes. Therefore, designers are forced to implement the IC in a wire-bonded package with less IO pins, increased die size, increased supply voltage, and/or reduced power consumption than desired.

Accordingly, there exists a need in the art for an integrated circuit package arrangement that overcomes the aforementioned deficiencies.

SUMMARY

An aspect of the invention relates to a semiconductor device. The semiconductor device can include: a first integrated circuit (IC) die having solder bumps; and a second IC die mounted on the first IC die, the second IC die having an active side and a backside opposite the active side, the second IC die including bond pads on the active side configured for wire-bonding, and solder bumps disposed on a backside opposite the active side; wherein the solder bumps of the first IC die are electrically and mechanically coupled to the solder bumps of the second IC die to form bump bonds.

In some embodiments, the first IC die includes bond pads, and the bond pads of the first IC die are configured for wire bonding. The second IC die includes at least one power converter circuit integrated on the active side, wherein the at least one power converter circuit is configured to provide current to the first IC die through the bump bonds responsive to at least one voltage applied to the bond pads of the second IC. The second IC die further includes through-die vias (TDVs) extending between the active side and the backside. The TDVs electrically couple the at least one power converter circuit to at least a portion of the solder bumps of the second IC die. In some embodiments, the second IC die further includes an inductor formed on the backside and through-die vias (TDVs) extending between the active side and the backside, wherein the inductor is serially coupled between at least a portion of the TDVs and at least a portion of the solder bumps of the second IC die. In some embodiments, the first IC die is configured to receive a plurality of voltages, wherein at least one of the plurality of voltages is the at least one voltage applied to the bond pads of the second IC die, and wherein none of the bond pads of the first IC die are configured to receive the at least one of the plurality of voltages.

Another aspect of the invention relates to a semiconductor device. The semiconductor device includes: a substrate; a first integrated circuit (IC) die, mounted to the substrate, including bond pads and solder bumps; first wire bonds electrically coupling the bond pads of the first IC die to the substrate; a second IC die, mounted to the first IC die, having an active side and a backside opposite the active side, the second IC die including bond pads on the active side, and solder bumps on the backside opposite the active side; and second wire bonds electrically coupling the bond pads of the second IC die to the substrate; wherein the solder bumps of the first IC die are electrically and mechanically coupled to the solder bumps of the second IC die to form bump bonds.

In some embodiments, the second IC die includes at least one power converter circuit integrated on the active side, wherein the at least one power converter circuit is configured to provide current to the first IC die through the bump bonds responsive to at least one voltage applied to the bond pads of the second IC. The second IC die can include through-die vias (TDVs) extending between the active side and the backside. The TDVs electrically couple the at least one power converter circuit to at least a portion of the solder bumps of the second IC die. In some embodiments, the second IC die further includes an inductor formed on the backside and through-die vias (TDVs) extending between the active side and the backside, wherein the inductor is serially coupled between at least a portion of the TDVs and at least a portion of the solder bumps of the second IC die. In some embodiments, the semiconductor device further includes at least one capacitor mounted to the substrate and electrically coupled to at least one of the second wire bonds. In some embodiments, the semiconductor device further includes at least one capacitor mounted to the substrate and each electrically coupled to at least one of the first wire bonds. In some embodiments, the at least one power converter circuit includes a direct current-to-direct current (DC-DC) converter. In some embodiments, the at least one power converter includes a linear regulator. In some embodiments, the first IC die is configured to receive a plurality of voltages, wherein at least one of the plurality of voltages is the at least one voltage applied to the bond pads of the second IC die, and wherein none of the bond pads of the first IC die are configured to receive the at least one of the plurality of voltages.

Another aspect of the invention relates to a method of forming a semiconductor device. The method can include: forming a first integrated circuit (IC) die having bond pads and solder bumps; obtaining a second IC die having an active side and a backside opposite the active side, the second IC die including bond pads on the active side configured for wire-bonding, and solder bumps disposed on a backside opposite the active side; mounting the second IC die to the first IC die by electrically and mechanically coupling the solder bumps of the first IC die and the solder bumps of the second IC die to form bump bonds; mounting the first IC die to a substrate; forming first wire bonds between the substrate and the bond pads of the first IC die; and forming second wire bonds between the substrate and the bond pads of the second IC die.

In some embodiments, the second IC die further includes through-die vias (TDVs) extending between the active side and the backside. The TDVs electrically couple the at least one power converter circuit to at least a portion of the solder bumps of the second IC die. In some embodiments, the second IC die further includes an inductor formed on the backside and through-die vias (TDVs) extending between the active side and the backside, wherein the inductor is serially coupled between at least a portion of the TDVs and at least a portion of the solder bumps of the second IC die. In some embodiments, at least one capacitor is mounted to the substrate and each electrically coupled to at least one of the second wire bonds. In some embodiments, at least one capacitor is mounted to the substrate and each electrically coupled to at least one of the first wire bonds. In some embodiments, the at least one power converter circuit includes at least one of a direct current-to-direct current (DC-DC) converter or a linear regulator.

BRIEF DESCRIPTION OF THE DRAWINGS

Accompanying drawings show exemplary embodiments in accordance with one or more aspects of the invention. However, the accompanying drawings should not be taken to limit the invention to the embodiments shown, but are for explanation and understanding only.

DETAILED DESCRIPTION

Figure 1:
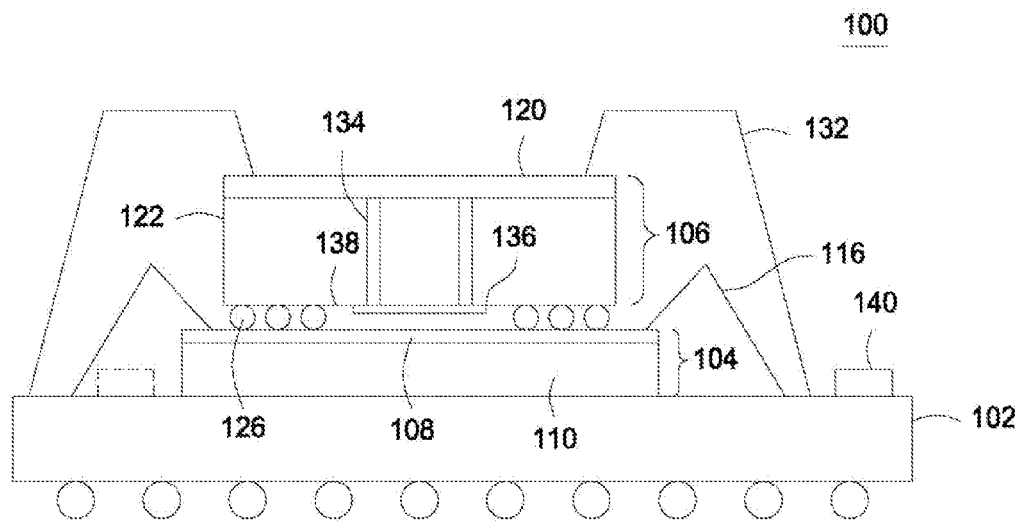
FIG. 1 is a cross-section view of an embodiment of a semiconductor device.
Figure 2:
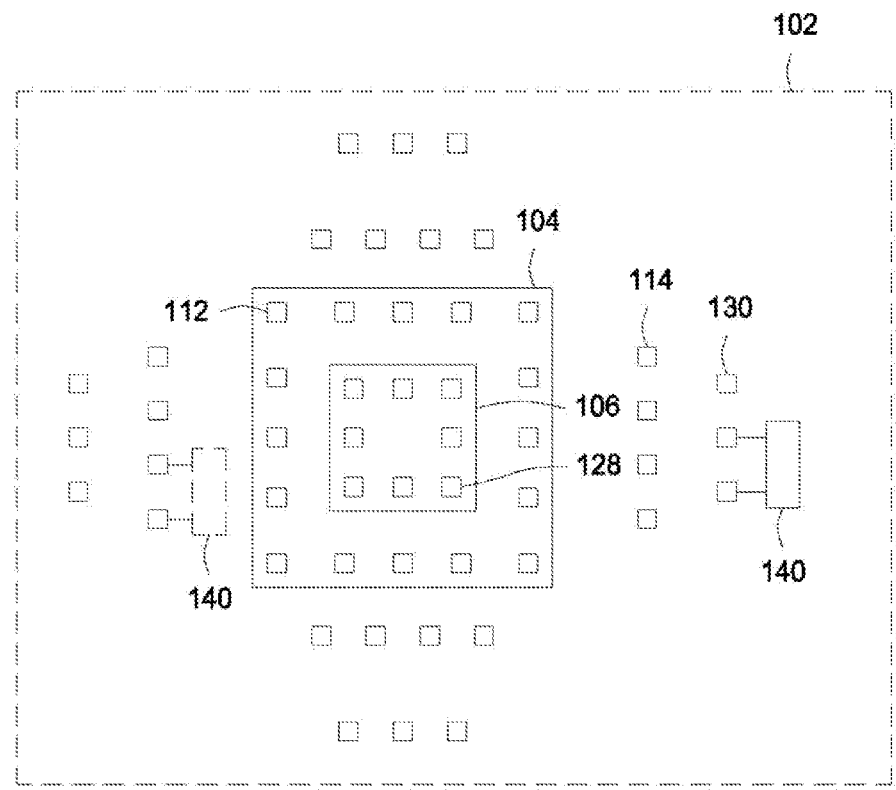
FIG. 2 is a top-down view of the semiconductor device of FIG. 1.
Figure 3:
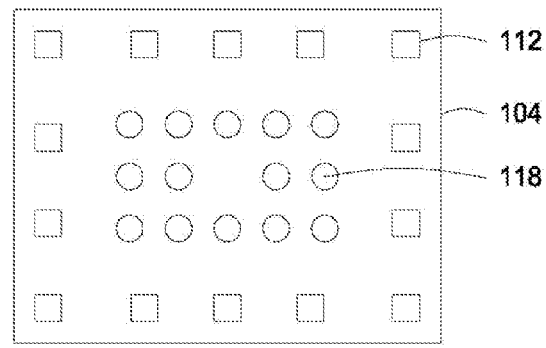
FIG. 3 is a top-down view of an integrated circuit (IC) die of FIG. 1.
Figure 4:
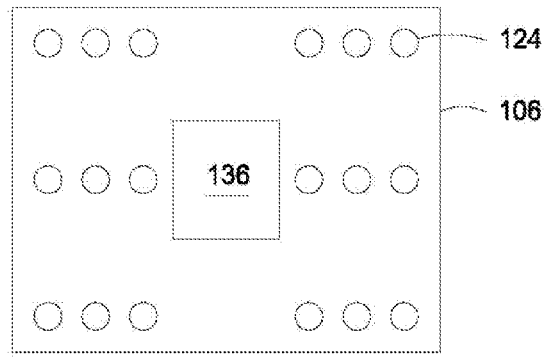
FIG. 4 is a bottom-up view of another IC die of FIG. 1.

FIG. 1 is a cross-section view of an embodiment of a semiconductor device 100. FIG. 2 is a top-down view of the semiconductor device 100. FIG. 3 is a top-down view of an integrated circuit (IC) die 104. FIG. 4 is a bottom-up view of a second IC die 106. With simultaneous reference to FIGS. 1-4, the semiconductor device 100 includes a substrate 102, the IC die 104 (also referred to as a first IC die), and the IC die 106 (also referred to as a second IC die). The first IC die 104 includes circuitry 108 formed on an active side of a semiconductor substrate 110. A backside opposite the active side of the first IC die 104 is mounted to the substrate 102 (e.g., using any type of attachment material known in the art). The circuitry 108 generally includes active components (e.g., transistors) and conductive interconnect.

Notably, the circuitry 108 includes bond pads 112 and solder bumps 118. The bond pads 112 are configured for wire-bonding. For example, the bond pads 112 can be patterned around the periphery of the first IC die 104. The substrate 102 includes lands 114 respectively associated with the bond pads 112. Wire bonds 116 are electrically and mechanically coupled between the bond pads 112 and the lands 114, respectively. In general, the solder bumps 118 are lithographically-created metal posts that facilitate electrical and mechanical connection to the second IC die 106, as discussed further below. Together, the bond pads 112 and the solder bumps 118 provide an external electrical interface of the circuitry 108. As discussed further below, the bond pads 112 are primarily used to provide an input/output (IO) signal interface, and the solder bumps 118 are used to provide a power supply interface.

The second IC die 106 includes circuitry 120 formed on an active side of a semiconductor substrate 122. The second IC die 106 also includes solder bumps 124 formed on a backside thereof opposite the active side. In general, the solder bumps 124 are lithographically-created metal posts that facilitate electrical and mechanical connection to the first IC die 104. Notably, the solder bumps 124 and the solder bumps 118 are formed in matched arrays. To electrically and mechanically mount the second IC die 106 to the first IC die 104, the solder bumps 124 and 118 can be pressed together and the combination thereof annealed to form diffusion bonds ("bonds 126"). The process of coupling devices together using solder bumps is well known in the art.

The circuitry 120 of the second IC die 106 includes bond pads 128. The bond pads 128 are configured for wire-bonding. For example, the bond pads 128 can be patterned around the periphery of the second IC die 106. The substrate 102 includes lands 130 respectively associated with the bond pads 128. Wire bonds 132 are electrically and mechanically coupled between the bond pads 128 and the lands 130, respectively.

The second IC die 106 also includes through-die vias (TDVs) 134. The TDVs 134 extend between the active side and backside of the second IC die 106. In general, TDVs 134 are holes etched through the second IC die 106. The holes are lined with an insulating material, and then filled with metal as know in the art. The metal provides a conductor that can electrically couple the circuitry 120 on the active side to other circuitry on or near the backside. In the embodiment shown in FIG. 1, the second IC die 106 includes an inductor circuit 136 formed on the backside. The TDVs 134 can be used to electrically couple the circuitry 120 with the inductor circuit 136. The inductor circuit 136 can be further coupled to the solder bumps 124 using patterned conductors 138 on the backside of the second IC die 106. In this manner, the inductor circuit 136 can be serially coupled between the TDVs 134 and the solder bumps 124 (and eventually the bonds 126).

The semiconductor device 100 can further include one or more capacitors 140. In some embodiments, a capacitor 140 can be mounted to the substrate 102 and electrically coupled to at least one of the lands 130 (and hence the wire bonds 132). As shown in FIG. 2, a capacitor 140 is shunted across two of the lands 130. In some embodiments, a capacitor 140 can be mounted to the substrate 102 and electrically coupled to at least one of the lands 114 (and hence the wire bonds 116). As shown in FIG. 2, an optional capacitor 140 is shunted across two of the lands 114. In general, the semiconductor device 100 can include one or more capacitors 140 coupled to the lands 130, the lands 114, or both.

The semiconductor device 100 can provide an integrated circuit with a stacked power converter. Notably, the circuitry 120 can include one or more power converter circuits, such as a direct current-to-direct current (DC-DC) converter, a linear regulator, voltage stabilizer, or like type circuit that has a DC input and a DC output. In general, a power converter circuit in the circuitry 120 has a higher voltage, lower current input and provides a lower voltage, higher current output. For example, the circuitry 120 can include a DC-DC converter that uses transistor-switching techniques to emulate a non-alternating current transformer. Power at the input of the DC-DC converter appears at the output (subject to losses due to inefficiency), but as a different voltage and current combination. For example, 5 watts may be input as 1 amp at 5 volts, and output at 5 amps at 1 volt. Well known "buck" converters can provide such a voltage step-down.

While a DC-DC converter such as a "buck" converter can be integrated onto a die using transistors, and inductor is required in series with the output. Hence, the inductor circuit 136 can be included for use with a DC-DC power converter of the circuitry 120. The inductor circuit 136 can be formed using well-known microelectromechanical systems (MEMS) techniques. A DC-DC converter of the circuitry 120 can be electrically coupled to the inductor circuit 136 using the TDVs 134. The inductor circuit 136 is thus in series between the circuitry 120 and the diffusion bonds 126. In this manner, a DC-DC converter can provide current to the first IC die 104 through the inductor circuit 136 and the diffusion bonds 126. Input voltage for the DC-DC converter in the circuitry 120 can be provided by the wire bonds 132.

Accordingly, a low-voltage, high-current path into the first IC die 104 is provided by the diffusion bonds 126 of solder bumps 118 and 124, rather than through the wire bonds 116 and the bond pads 112 of the first IC die 104. This configuration of the semiconductor device 100 eliminates the need to dedicate bond pads 112 for use with such high-current supplies. As is known, bond pads and wire bonds have a limited current carrying capacity. Consequently, higher-current requirements have increased the number of bond pads that must be set aside for power supply. Since such higher current supplies are not directly coupled to the first IC die 104 through the wire bonds 116 and the bond pads 112, the first IC die 104 can use more of the bond pads 112 for IO or other uses and/or can be smaller in size.

Note that the term "higher current" is relative and can be based on many factors, including bond pad and wire bond current carrying capacity, design power and voltage requirements of the circuitry 108 on the first IC die 104, and the like. A designer may designate some power supplies as high-current and thus use the second IC die 106 to provide such supplies. Other power supplies may be lower-current and may still be provided to the first IC die 104 through the wire bonds 116 and the bond pads 112. Any power supplied required by the first die can be provided by the second die. Note that any power supply can be provided by the second IC die 106, regardless of magnitude of the current, including all of the power supplies required by the first IC die 104.

The capacitor(s) 140 can be used to implement decoupling (bypass) for the power supplies. In some embodiments, one or more capacitors 140 can be shunted across each power supply at the input to the second IC die 106 (e.g., across lands 130). In other embodiments, one or more capacitors 140 can be shunted across lands 114 that are coupled to bond pads 112 of the first IC die 104. This requires that the first IC die 104 dedicate some of the bond pads 112 for decoupling purposes. However, relatively few of the bond pads 112 need be dedicated for decoupling purposes, since the AC-only current flowing through the capacitor(s) 140 is relatively low as compared to the supplies.

As noted above, the circuitry 120 of the second IC die 106 can include one or more power converter circuits. While FIG. 1 shows a single second IC die 106, those skilled in the art will appreciate that multiple IC die can be mounted to the first IC die 104 in similar fashion as second IC die 106, each providing one or more power converter circuits.

Figure 5:
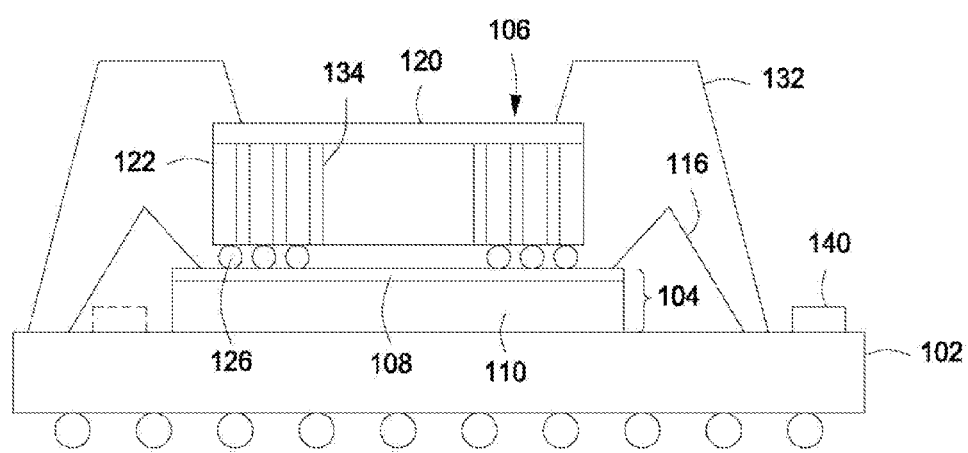
FIG. 5 is a cross-section view of another embodiment of a semiconductor device.

FIG. 5 is a cross-section view of another embodiment of a semiconductor device 500. Elements of FIG. 5 that are the same or similar to those of FIGS. 1-4 are designated with identical reference numerals and are described in detail above. In the present embodiment, the inductor circuit 136 is omitted. For example, the circuitry 120 may include a different type of power converter circuit than a DC-DC converter that does not require an output inductor. For example, the circuitry 120 can include one or more linear regulator circuits for providing power conversion in the manner described above. In such an embodiment, the TDVs 134 can be coupled directly to the solder bumps 124 (and hence the diffusion bonds 126) without traversing an inductor circuit.

Those skilled in the art will appreciate that a combination of the embodiment shown in FIG. 1 and the embodiment shown in FIG. 5 can be employed. Notably, the circuitry 120 can include both a DC-DC converter or the like that requires the inductor circuit 136, and a linear regulator or the like that does not require the inductor circuit 136. In such a combined embodiment, some of the TDVs 134 can be coupled to the inductor circuit 136, and others of the TDVs 134 can be directly coupled to the solder bumps 124.

Figure 6:
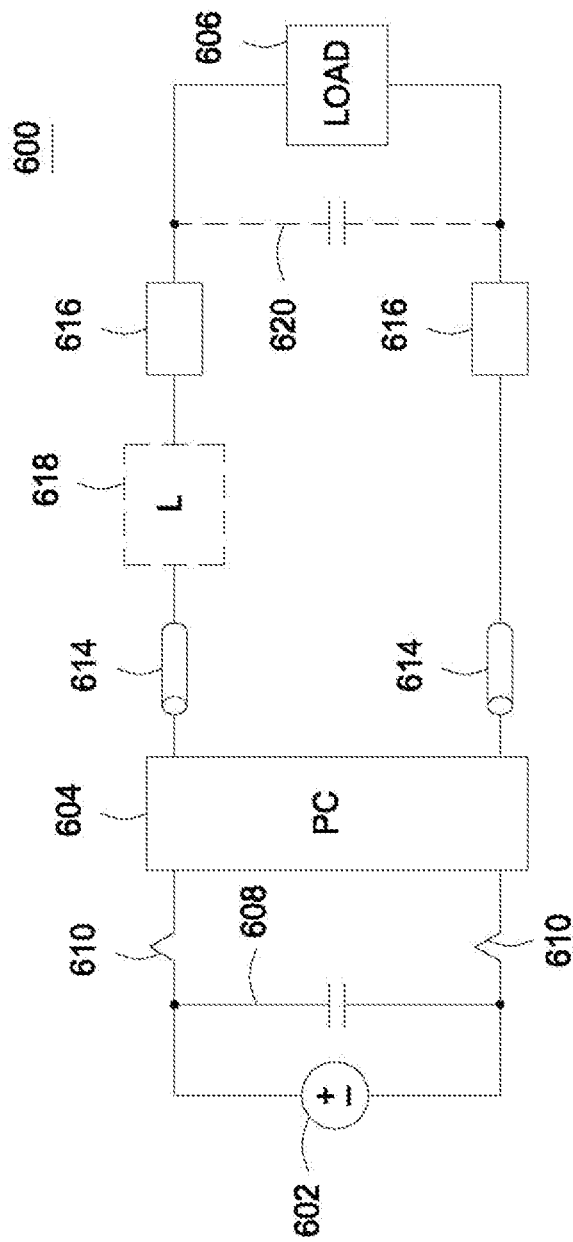
FIG. 6 is a schematic diagram depicting a circuit arrangement effectuated by the semiconductor devices of FIG. 1, FIG. 5, or a combination thereof.

FIG. 6 is a schematic diagram depicting a circuit arrangement 600 effectuated by the semiconductor devices 100, 500, or a combination thereof. The circuit arrangement 600 includes a voltage supply 602 coupled to a power converter 604, which in turn drives a load 606. The voltage supply 602 can be any supply, such as a higher voltage, lower current supply. The voltage supply 602 is provided through the substrate 102 (e.g., received through a package or circuit board to which the substrate 102 can be mounted). A decoupling capacitor 608 can be included across the voltage supply 602 (e.g., a capacitor 140 between wire bonds 132). The voltage supply 602 is coupled to the power converter 604 through wire bonds 610 (e.g., specific ones of the wire bonds 132). The power converter 604 can include one or more converter circuits, such as DC-DC converters, linear regulators, or the like. The power converter 604 is coupled to diffusion bonds 616 through TDVs 614 (e.g., specific ones of the TDVs 134 and the diffusion bonds 126). If required, an inductor circuit 618 can be employed at the output of the power converter 604 on the current-supply side of the load 606 (e.g., the inductor circuit 136). A capacitor 620 can be shunted across the load 606 instead of, or in addition to, the capacitor 608. The capacitor 620 can be implemented as a capacitor 140 coupled between wire bonds 116 of the first IC die 104.

Figure 7:
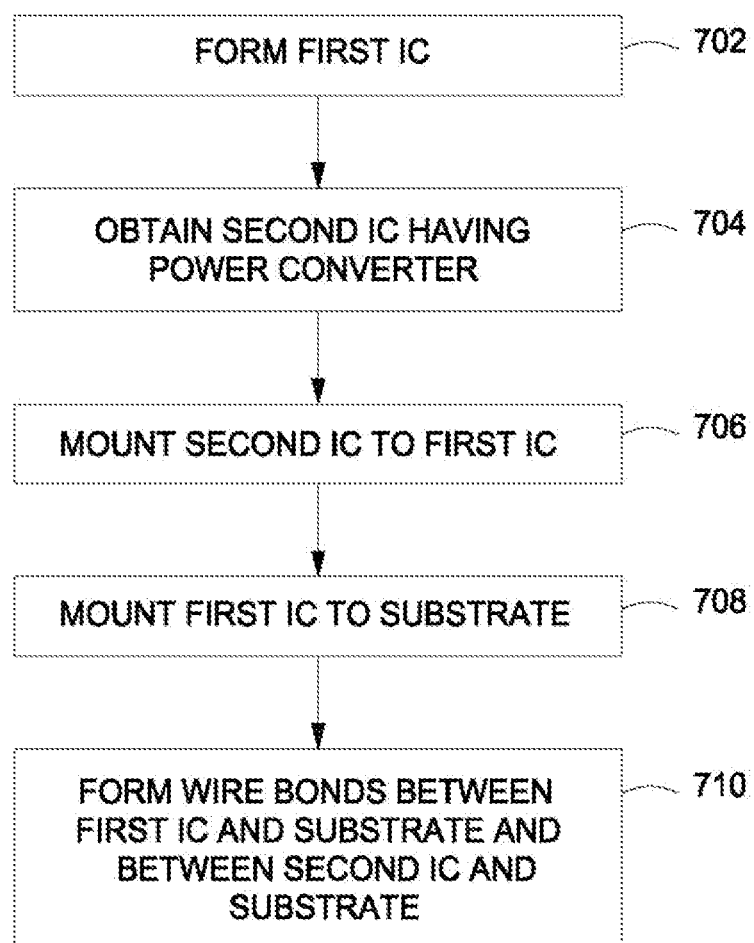
FIG. 7 is a flow diagram depicting an embodiment of a method of forming a semiconductor device.

FIG. 7 is a flow diagram depicting an embodiment of a method 700 of forming a semiconductor device. The method 700 begins at step 702, where a first IC die having bond pads and solder bumps is formed. The first IC die can be formed using conventional semiconductor manufacturing processes. At step 704, a second IC die is obtained having at least one power converter circuit. The second IC die includes an active side and a backside opposite the active side, bond pads on the active side configured for wire-bonding, and solder bumps disposed on a backside opposite the active side. At step 706, the second IC die is mounted to the first IC die by electrically and mechanically coupling the solder bumps of the first IC die and the solder bumps of the second IC die to form bump bonds (diffusion bonds as described above). At step 708, the first IC die is mounted to a substrate. At step 710, first wire bonds are formed between the substrate and the bond pads of the first IC die, and second wire bonds are formed between the substrate and the bond pads of the second IC die. In this manner, a semiconductor device such as that described above in FIGS. 1-6 can be formed.

In some embodiments, the second IC die obtained at step 704 includes TDVs extending between the active side and the backside. The TDVs electrically couple the at least one power converter circuit to at least a portion of the solder bumps of the second IC die. In some embodiments, the second IC die obtained at step 704 further includes an inductor formed on the backside and TDVs extending between the active side and the backside, wherein the inductor is serially coupled between at least a portion of the TDVs and at least a portion of the solder bumps of the second IC die. In some embodiments, at least one capacitor is mounted to the substrate. Each of the capacitors can be electrically coupled to either the first wire bonds or the second wire bonds.

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Claims listing steps do not imply any order of the steps. Trademarks are the property of their respective owners.

What is claimed is:

1. A semiconductor device, comprising:
   a first integrated circuit (IC) die having solder bumps; and
   a second IC die mounted on the first IC die, the second IC die having an active side and a backside opposite the active side, the second IC die including bond pads on the active side configured for wire-bonding, and solder bumps disposed on a backside opposite the active side, the second IC die including at least one power converter circuit receiving an input from a bond pad of the bond pads by way of a first wire bond, the input having a first voltage and a first current, the second IC die having through-die vias (TDVs) extending between the active side and the backside;
   wherein the solder bumps of the first IC die are electrically and mechanically coupled to the solder bumps of the second IC die to form bump bonds, wherein the at least one power converter circuit provides, responsive to the input, an output having a second voltage and a second current to the first IC die by way of the TDVs of the second IC die and the bump bonds, and wherein the second current is greater than the first current;
   wherein the first IC die includes bond pads that are configured for wire bonding, and a second wire bond electrically couples a bond pad of the bond pads of the first IC die to a substrate to provide power to the first IC die having a third current that is a lower current than the second current; and
   wherein the second IC die further includes an inductor formed on the backside and coupled to the TDVs.

2. The semiconductor device of claim 1, wherein the through-die vias electrically couple the at least one power converter circuit to at least a portion of the solder bumps of the second IC die.

3. The semiconductor device of claim 1, wherein the inductor is serially coupled between at least a portion of the TDVs and at least a portion of the solder bumps of the second IC die.

4. The semiconductor device of claim 1, wherein the first IC die is configured to receive a plurality of voltages, wherein at least one of the plurality of voltages is the applied to the bond pads of the second IC die, and wherein none of the bond pads of the first IC die are configured to receive the at least one of the plurality of voltages.

5. The semiconductor device of claim 1, wherein the inductor circuit is coupled to the solder bumps using patterned conductors on the backside of the second IC die.

6. The semiconductor device of claim 5, wherein the second current is provided to the first IC die through the inductor.

7. A semiconductor device, comprising:
   a substrate;
   a first integrated circuit (IC) die, mounted to the substrate, including bond pads and solder bumps;
   first wire bonds electrically coupling the bond pads of the first IC die to the substrate, wherein the first wire bonds provide an input having a first voltage and a first current to the first IC die;
   a second IC die, mounted to the first IC die, having an active side and a backside opposite the active side, the second IC die including bond pads on the active side, at least one power converter circuit to provide, responsive to an input voltage, an output having a second voltage and a second current to the first IC die, through-via dies (TVDs) extending between the active side and the backside, and solder bumps on the backside opposite the active side, wherein the second current is greater than the first current; and
   second wire bonds electrically coupling the bond pads of the second IC die to the substrate, wherein the second IC die receives the input voltage and a third current that is a lower current than the second current by way of the second wire bonds;
   wherein the solder bumps of the first IC die are electrically and mechanically coupled to the solder bumps of the second IC die to form bump bonds, the through-die vias of the second IC die and the bump bonds providing the output of the at least one power converter circuit to the first IC die; and
   wherein the second IC die further includes an inductor formed on the backside and coupled to the through-die vias (TDVs).

8. The semiconductor device of claim 7, wherein the inductor circuit is coupled to the solder bumps using patterned conductors on the backside of the second IC die.

9. The semiconductor device of claim 7, wherein the TDVs electrically couple the at least one power converter circuit to at least a portion of the solder bumps of the second IC die.

10. The semiconductor device of claim 7, wherein the inductor is serially coupled between at least a portion of the TDVs and at least a portion of the solder bumps of the second IC die.

11. The semiconductor device of claim 7, wherein the at least one power converter includes a DC-DC converter or a linear regulator.

12. The semiconductor device of claim 7, further comprising:
    at least one capacitor mounted to the substrate and each electrically coupled to at least one of the second wire bonds.

13. The semiconductor device of claim 7, further comprising:
    at least one capacitor mounted to the substrate and each electrically coupled to at least one of the first wire bonds.

14. The semiconductor device of claim 7, wherein the first IC die is configured to receive a plurality of voltages, wherein at least one of the plurality of voltages is applied to the bond pads of the second IC die through the second wire bonds, and wherein none of the bond pads of the first IC die are configured to receive the at least one of the plurality of voltages through the first wire bonds.

15. A method of forming a semiconductor device, comprising:
    forming a first integrated circuit (IC) die having bond pads and solder bumps;
    obtaining a second IC die having an active side and a backside opposite the active side, the second IC die including bond pads on the active side configured for wire-bonding, and solder bumps disposed on a backside opposite the active side;

mounting the second IC die to the first IC die by electrically and mechanically coupling the solder bumps of the first IC die and the solder bumps of the second IC die to form bump bonds, wherein the second IC die includes at least one power converter circuit and through-die vias extending between the active side and the back side;

mounting the first IC die to a substrate, wherein the first IC die includes bond pads;

forming first wire bonds between the substrate and the bond pads of the first IC die;

providing an input voltage to the first IC die using the first wire bonds;

forming second wire bonds between the substrate and the bond pads of the second IC die;

providing an input having a first voltage and a first current to the second IC die through the second wire bonds; and providing, responsive to the first voltage, an output having a second voltage and a second current, from the at least one power converter circuit, to the first IC die by way of the through-die vias of the second IC die and the bump bonds, wherein the second current is greater than the first current, wherein the first wire bonds provide power to the first IC die having a third current that is a lower current than the second current provided to the first IC die;

wherein the second IC die further includes an inductor formed on the backside and coupled to the through-die vias (TDVs).

16. The method of claim 15, wherein the at least one power converter circuit is integrated on the active side.

17. The method of claim 16, wherein the through-die vias electrically couple the at least one power converter circuit to at least a portion of the solder bumps of the second IC die.

18. The method of claim 16, wherein the through-die vias (TDVs) extend between the active side and the backside, and wherein the inductor is serially coupled between at least a portion of the TDVs and at least a portion of the solder bumps of the second IC die.

19. The method of claim 15, further comprising:
mounting at least one capacitor to the substrate, each electrically coupled to at least one of the second wire bonds.

20. The method of claim 15, further comprising:
mounting at least one capacitor to the substrate, each electrically coupled to at least one of the first wire bonds.

* * * * *